Figure 1:
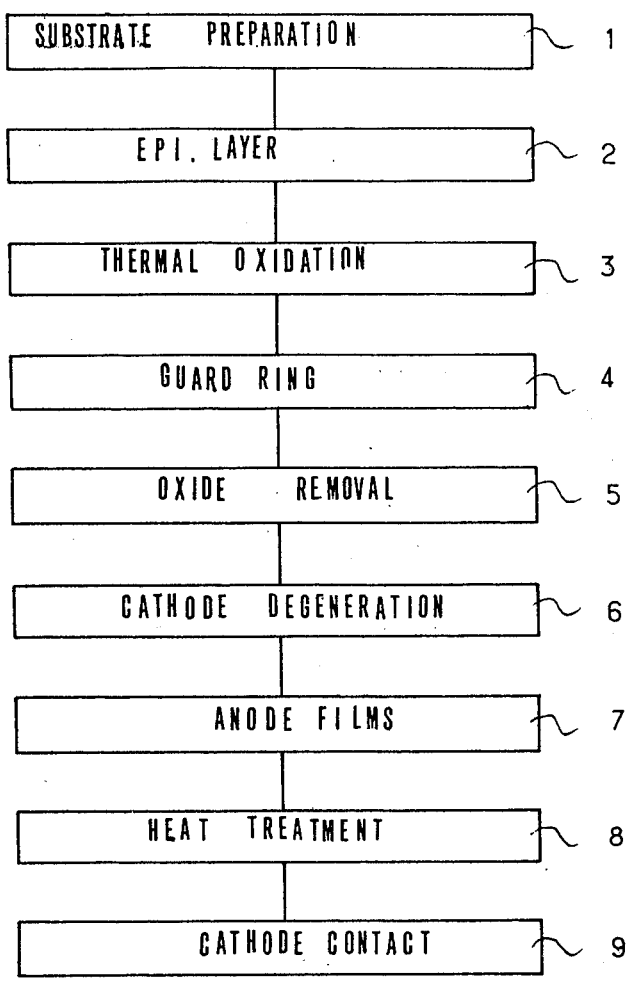

United States Patent [19]
Damene

[11] 4,136,348
[45] Jan. 23, 1979

[54] MANUFACTURE OF GOLD BARRIER SCHOTTKY DIODES

[75] Inventor: Guy Damene, Paris, France

[73] Assignee: Societe Lignes Telegraphiques et Telephoniques, Paris, France

[21] Appl. No.: 815,512

[22] Filed: Jul. 14, 1977

[30] Foreign Application Priority Data

Aug. 3, 1976 [FR] France .................................. 76 23649

[51] Int. Cl.² ...................... H01L 29/48; H01L 29/56
[52] U.S. Cl. ........................................... 357/15; 427/84; 427/89; 427/350; 427/383 A; 427/383 D
[58] Field of Search ............... 427/84, 89, 250, 383 A, 427/383 D; 357/15

[56] References Cited

U.S. PATENT DOCUMENTS

| | | | |
|---|---|---|---|
| 3,463,971 | 8/1969 | Soshea | 357/15 |
| 3,706,128 | 12/1972 | Heer | 29/578 |
| 3,785,892 | 1/1974 | Terry | 156/631 |
| 3,819,432 | 6/1974 | Knicpkamp | 156/656 |
| 3,971,057 | 7/1976 | Connorr | 357/54 |
| 4,065,588 | 12/1977 | Arnold | 427/89 |

*Primary Examiner*—Michael F. Esposito
*Attorney, Agent, or Firm*—Kemon & Estabrook

[57] ABSTRACT

A low reverse current gold barrier Schottky diode is produced by introduction of a highly reducing metal layer between the substrate and the gold layer through which the gold is diffused to contact the substrate. As such reducing metal, chromium gives good results.

5 Claims, 3 Drawing Figures

MANUFACTURE OF GOLD BARRIER SCHOTTKY DIODES

BACKGROUND OF THE INVENTION — PRIOR ART

The present invention concerns an improved process for the manufacture of planar Schottky barrier diodes having a guard ring.

Such a structure is well known to the person skilled in the art. It forms the subject of many works and a description thereof is to be found inter alia in U.S. Pat. No. 3,463,971, filed on Apr. 17, 1967.

The advantage of such structures resides in that the barrier is formed by the very metal which serves as the output metal which facilitates the bonding of the output conductor of the diode. However, the use of a gold barrier often leads to a lack of reliability in time, which results essentially from an effect of diffusion of the gold in the silicon, which is of particular importance in the case of device operating at high temperature, such as power rectifiers. The deterioration of the barrier results from complex phenomena. It is probably promoted by the presence of impurities at the interface between the metal and the silicon. The present invention has essentially for its object to improve the process for the manufacture of gold-silicon barrier diodes with high stability in time, as well as enhanced stability at high temperature. The invention has also for its object to provide a process for the manufacture of guard ring Schottky diodes with high reverse voltages.

BRIEF SUMMARY OF THE INVENTION

According to the invention, process for the manufacture of Schottky diodes with a guard ring and a gold-silicon barrier consists in that a film of reducing metal having a thickness between several thousand and two hundred ångstroms is deposited on the silicon prior to the deposition of the barrier metal film, the structure being subjected to a heat treatment which ensures diffusion of the barrier metal through the reducing film at a temperature below the formation temperature of the gold-silicon eutectic.

In accordance with an essential feature of the invention, the solid state diffusion of gold through the metal film is effected by heat treatment at a temperature above 300 degrees and below the temperature at which the gold-silicon eutectic is formed (377° C.).

LIST OF DRAWINGS

Figure 2:
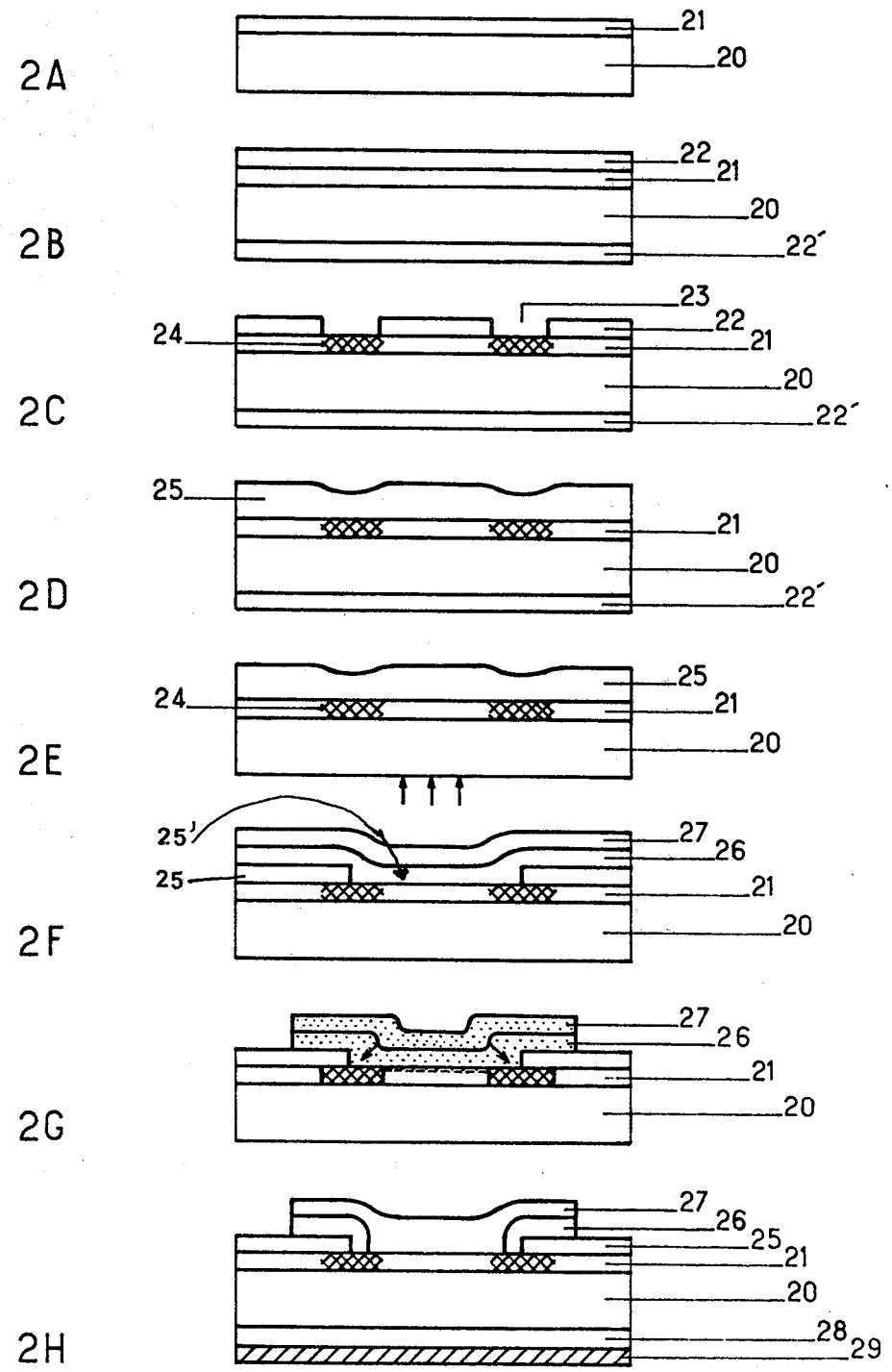
Figure 3:
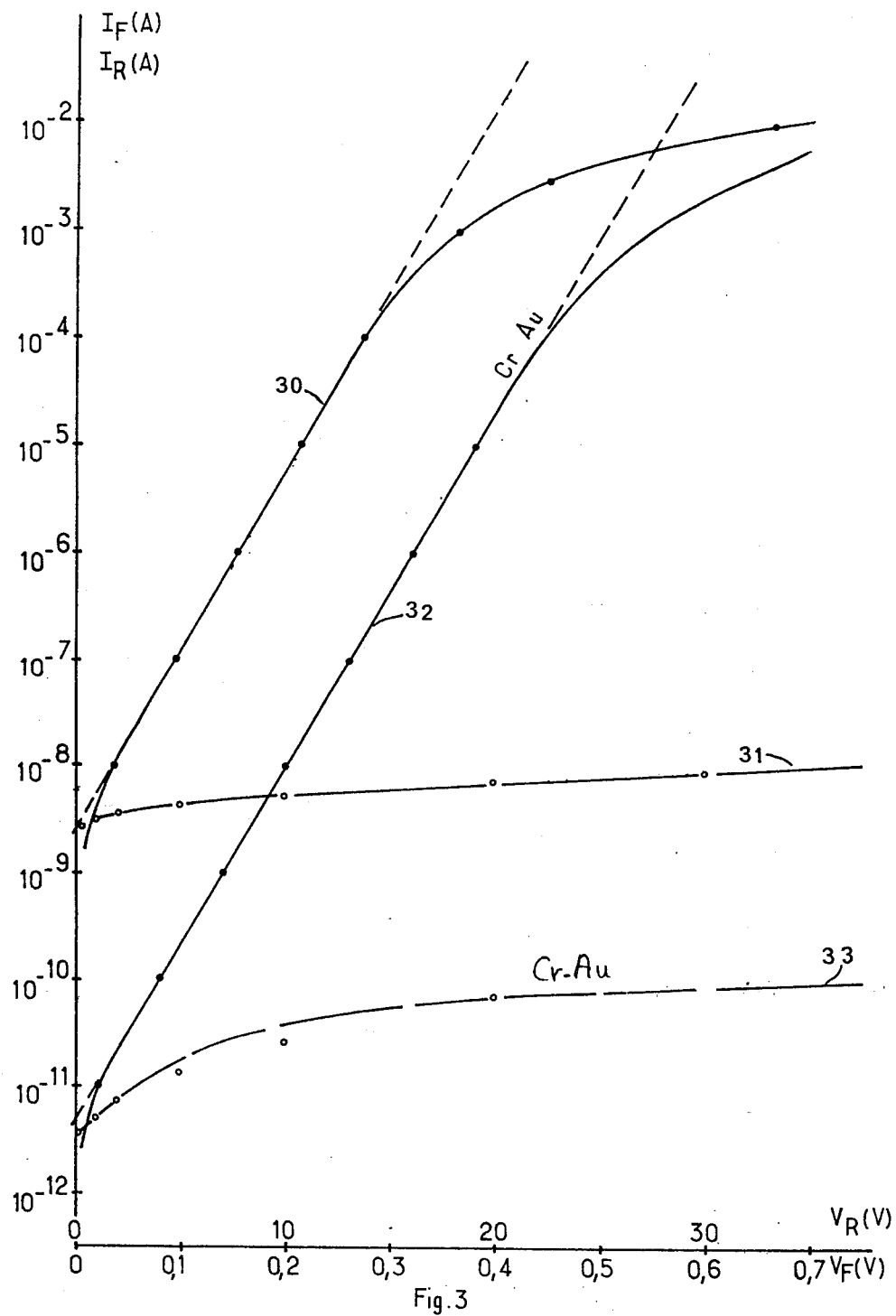

The invention will be readily understood by reference to the following description and to the accompanying FIGS. 1 to 3, which are given by way of non-limiting example and in which:

FIG. 1 is the block diagram of the manufacture process of the diodes according to the invention, FIG. 2 diagrammatically illustrates the diode in various stages of manufacture, and FIG. 3 is a characteristic of diodes produced in accordance with the invention.

DETAILED DISCLOSURE

There are shown at 1 in FIG. 1 the operations for the preparation of the substrate, which is of fairly highly doped n-type silicon (about $5 \cdot 10^{19}$ atoms per cubic centimeter). As is well known, despite all care taken in the various cleaning operations, a residual oxide layer of about 60 ångstroms will spontaneously be formed on the surface of the silicon. An epitaxial layer is then deposited (stage 2) on the substrate at low temperature in the vapour phase, with a thickness of the order of 5 micrometers, the resistivity of which is 2 ohm-cm.

There are shown in FIG. 2A a substrate 20 and the epitaxial layer 21, it being understood that the relative thicknesses cannot be shown on the same scale. The wafer provided with its epitaxial layer is then subjected to a thermal oxidation (stage 3) to a thickness of about 0.5 micrometer on both faces of the wafer, to provide masking for later manufacturing steps. These layers are respectively denoted by 22 and 22' in FIG. 2B. The guard ring is formed (stage 4) by the usual photo-masking technique, this being followed by etching of the layer 22 to define an annular window in which a p-type impurity is diffused in the vapour phase, and then the structure illustrated in FIG. 2C is obtained which consists of the substrate 20, the epitaxial layer 21 on which there lies the oxide layer 22 having the window 23, level with which there is situated the diffused annular zone 24 constituting the guard ring of the diode. The reoxidation of the window 23 resulting in the formation of a new continuous oxide layer 25 as illustrated in FIG. 2D occurs in the course of the diffusion. There then takes place the preparation of the cathode contact (stage 5) by attack of the oxide layer 22' and doping (stage 6), for example by ionic implantation, of the lower face of the substrate 20 for the purpose of degenerating the silicon in order to promote the establishment of the cathode contact, as illustrated in FIG. 2D.

The preparation of the anode is carried out by know photoetching processes, the aperture of the anodic window 25' being defined by the mean circumference of the guard ring 24. A layer of reducing metal, for example chromium, is evaporated in vacuo on the previously cleaned and heated substrate. In the same enclosure, a gold layer is deposited by evaporation in vacuo. These two operations correspond to the operation stage 7. There is shown at 2F the diode thus treated, the two metallic layers being denoted by 26 and 27 respectively. In accordance with an essential feature of the invention, the structure thus formed is subjected to a heat treatment (stage 8) at a temperature between 350° C. and 377° C. for one hour, which is intended to ensure the diffusion of the gold 27 through the chromium layer 26 until it comes into contact with the epitaxial silicon layer 21. This heat treatment may take place either directly in the vacuum enclosure used for the deposition of the metal films, or in an independent furnace but it is carried out in air at atmospheric pressure. There is then obtained the structure illustrated in FIG. 2G. The cathode contact is thereafter formed, in the well-known manner (stage 9), preferably in the same way as the anode, but without masking (layer 28 being chromium and layer 29 gold), the cathode contact being applied to the whole of the lower face of the substrate 20. All the operations involving evaporation and heating are grouped together in stage 9. In the case of the cathode, it is preferable to keep the gold layer on the outer surface in order to facilitate the bonding of the cathode connection. The diagram of the completed diode is shown in FIG. 2H. The layers 28 and 29 correspond respectively to the chromium film and the gold film constituting the cathode contact.

It is to be understood that the structure just described constitutes a particular illustrative example. An entirely equivalent process of manufacture may be carried out, starting with a p-type substrate with an n-type guard ring.

Diodes have been produced by using as the reducing films 26 and 28 titanium films having a thickness of the order of 200 Å on which lies a gold film 27. The heat treatment constituting stage 8 is then as follows: heating at 300° C. for one hour. The other manufacturing stages are identical to those described in the foregoing.

A relation exists between the duration of the treatment, the temperature and the thickness of the layer. The two examples given correspond to the same duration for manufacture planning facility which does not in any way limit the scope of the invention. Reducing film thickness between several thousand and 200 Å have proven usefull. The limitations are due to production requirements rather than to electronic requirements.

There are shown in FIG. 3 the voltage-current (forward $I_F$-$V_F$ and reverse $I_R$-$V_R$) characteristics of a reference diode (curves 30 and 31) consisting of a gold-barrier Schottky diode having a guard ring, produced in accordance with the prior art, and the same characteristics, 32 and 33 respectively, of a diode of like dimensions made on a substrate having very similar characteristics by the process of the invention. The scales are linear in voltage, the graduations of the forward characteristic ($V_F$) are in volts, as well as those of the reverse characteristic ($V_R$), and a ratio of 50:1 exists between the values of a common point on the two graduations. The scale of the ordinates is logarithmic and the same for the forward current ($I_F$) and the reverse current ($I_R$), the unit being the ampere.

As will be apparent, the two characteristics show a small knee in the neighbourhood of the zero voltages followed by two very substantially parallel linear portions which bend at voltage values above 10 V. This non-linearity is due inter alia to the action of the guard ring. If the linear portions of the curves 30 and 32 are prolonged in the direction of the low voltages, there is obtained at zero value a current value called saturation current which is typically of $3 \cdot 10^{-12}$ A for the diodes of the invention and $1.5 \cdot 10^{-9}$ A for the diodes of the prior art, which value coincides with that of the reverse voltage-current curve. Likewise, if the values of the currents at 0.1 volt are compared, it will be seen that they are about $1.2 \cdot 10^{-10}$ A for the diodes of the invention and $10^{-7}$ A for the diodes of the prior art. Similarly, the reverse characteristics are very substantially linear, except in the immediate neighbourhood of the origin. The reverse current of a diode according to the invention at $-20$ V is about $8 \cdot 10^{-11}$ A, while it is in the neighbourhood of $8 \cdot 10^{-9}$ A in the case of the diodes according to the prior art.

What I claim:

1. Process for the manufacture of Schottky diodes with a guard ring and a gold-silicon barrier, consisting in that a film of reducing metal having a thickness between several thousand and two hundred ångstroms is deposited on the silicon prior to the deposition of the barrier metal film, the structure being subjected to a heat treatment which ensures diffusion of the barrier metal through the reducing film at a temperature above 300° C. but below the formation temperature of the gold-silicon eutectic.

2. Process for the manufacture of Schottky barrier diodes with a guard ring according to claim 1, wherein the reducing metal is chromium and the heat treatment is carried out at a temperature between 350° C. and less than 377° C. for a period of about one hour and a chromium film of a few thousand ångstrom thick.

3. Process for the manufacture of Schottky barrier diodes having a guard ring with a gold-silicon barrier according to claim 2, wherein the two electrodes of the diode are produced by means of deposition of two successive metal films consisting of a reducing metal in contact with the silicon and of gold above the reducing metal respectively.

4. Process for the manufacture of Schottky diodes having a guard ring according to claim 1, wherein the reducing metal is titanium and the heat treatment is continued for one hour at 300° C. when the layer has a thickness of 200 Å.

5. A low reverse current Schottky barrier diode produced by the process of claim 1.

* * * * *